United States Patent
Qiu et al.

(10) Patent No.: US 8,791,757 B2
(45) Date of Patent: *Jul. 29, 2014

(54) SELF-CALIBRATING GAIN CONTROL SYSTEM

(71) Applicant: MaxLinear, Inc., Carlsbad, CA (US)

(72) Inventors: James Qiu, Carlsbad, CA (US); Sridhar Ramesh, Carlsbad, CA (US)

(73) Assignee: MaxLinear, Inc., Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/845,348

(22) Filed: Mar. 18, 2013

(65) Prior Publication Data

US 2013/0214857 A1 Aug. 22, 2013

Related U.S. Application Data

(63) Continuation of application No. 13/568,865, filed on Aug. 7, 2012, now Pat. No. 8,427,232, which is a continuation of application No. 13/493,854, filed on Jun. 11, 2012, now Pat. No. 8,253,488, which is a continuation of application No. 12/799,870, filed on May 4, 2010, now Pat. No. 8,198,940.

(60) Provisional application No. 61/215,303, filed on May 4, 2009.

(51) Int. Cl.
*H03G 3/20* (2006.01)
*H03G 3/30* (2006.01)

(52) U.S. Cl.
CPC .............. *H03G 3/20* (2013.01); *H03G 3/3052* (2013.01)
USPC ......................................... 330/133; 330/140

(58) Field of Classification Search
USPC ................................. 330/133, 140, 141, 279
See application file for complete search history.

(56) References Cited

U.S. PATENT DOCUMENTS

| | | | |
|---|---|---|---|
| 5,917,865 A | 6/1999 | Kopmeiners et al. | |
| 6,100,761 A | 8/2000 | Ezell | |
| 6,191,626 B1 | 2/2001 | Pryshy et al. | |
| 6,417,730 B1 | 7/2002 | Segallis et al. | |
| 6,498,927 B2 | 12/2002 | Kang et al. | |
| 6,784,738 B1 | 8/2004 | Jin et al. | |
| 6,897,729 B1 | 5/2005 | Jin et al. | |
| 6,952,132 B2 | 10/2005 | Bhattacharjee et al. | |
| 7,215,763 B1 | 5/2007 | Keller et al. | |
| 7,222,037 B2 | 5/2007 | Mushirahad et al. | |
| 7,292,169 B2 | 11/2007 | Mori et al. | |
| 7,352,310 B2 | 4/2008 | Mori et al. | |
| 7,555,263 B1 | 6/2009 | Rofougaran et al. | |
| 2001/0022821 A1 | 9/2001 | Ichihara | |
| 2006/0222118 A1* | 10/2006 | Murthy et al. | 375/345 |

* cited by examiner

*Primary Examiner* — Steven J Mottola
(74) *Attorney, Agent, or Firm* — McAndrews, Held & Malloy, Ltd.

(57) ABSTRACT

A circuit for self-calibrating a gain control system samples the output of a digital amplifier coupled in series with one or more analog amplifiers to correct errors in a discrete stepped gain control. A digital gain control circuit controls both the digital amplifier and at least one analog amplifier to produce a smooth linear and continuous gain, wherein perturbations in the digital control of gain are smoothed by a signal applied to gain control circuit by a gain step correction circuit.

31 Claims, 2 Drawing Sheets

SELF-CALIBRATING GAIN CONTROL SYSTEM

This patent application is a continuation of U.S. patent application Ser. No. 13/568,865 filed on Aug. 7, 2012 and now patented as U.S. Pat. No. 8,253,488, which is a continuation of U.S. patent application Ser. No. 13/493,854 filed on Jun. 11, 2012 and now patented as U.S. Pat. No. 8,253,488, which is a continuation of U.S. patent application Ser. No. 12/799,870 filed on May 4, 2010 and now patented as U.S. Pat. No. 8,198,940, which claims priority to U.S. Provisional Patent Application No. 61/215,303 filed on May 4, 2009. Each of these applications is herein incorporated by reference in its entirety.

BACKGROUND OF THE INVENTION

1. Field of Invention

This invention is related to signal gain control and in particular self-calibrating gain control to correct for signal errors.

2. Description or Related Art

In signal receiving circuits, such as with RF receivers, it is meaningful to have automatic gain control to insure that a constant amplitude signal is available for processing by subsequent circuitry. Error signals in the gain control circuitry often cause abrupt changes in gain compared to what is expected and provide fluctuations in the amplified signal. These unexpected changes in the gain and the resulting changes in signal strength to subsequent downstream signal processing can be disruptive to the quality of the signal results, as could be seen with RF communications between cellular phones.

U.S. Pat. No. 7,555,263 B1 (Rofougaran et al.) is directed to a self-testing unit that is used to determine gain, frequency characteristics, selectivity, noise floor, and distortion behavior of a receiver and transmitter. U.S. Pat. No. 7,352,310 (Mori et al.) and U.S. Pat. No. 7,292,169 B2 (Mori et al.) is directed to a receiver comprising an A/D converter, a controller and a variable gain amplifier that adjusts the gain of the amplifier based on an m-bit and a n-bit digital signal. U.S. Pat. No. 7,222,037 B2 (Mushirahad et al.) is directed to a method of automatic gain control in both the analog and digital domain for an incoming analog signal. U.S. Pat. No. 7,215,763 B1 (Keller et al.) discloses a method for configuring a transceiver for providing data communications via residential wiring and uses a received pulse signal to adjust gain of an input circuit. In U.S. Pat. No. 6,952,132 B2 (Bhattacharjee et al.) a system and method is directed to provide automatic gain control through analog and digital techniques where overall gain is monitored by a power detection circuit. U.S. Pat. No. 6,897,729 B1 (Jin et al.) is directed to an RF low noise amplifier with gain control through control of a bias circuit to generate a bias current for the amplifier to vary gain.

U.S. Pat. No. 6,784,738 B1 (Jin et al.) is directed to an amplifier to amplify an RF signal wherein the amplifier transconductance is controlled to reduce variations in gain of the amplifier under changing conditions. In U.S. Pat. No. 6,498,927 B2 (Kang et al.) an apparatus and method is directed to controlling gain in a communication system between a receiver and a baseband modem. U.S. Pat. No. 6,417,730 (Segallis et al.) is directed to an automatic gain control system comprising at least one variable gain component and a sensor for sensing signal amplitude from at least one variable gain component. In U.S. Pat. No. 6,191,626 B1 (Pryshy et al.) a method and apparatus is directed to compensating input threshold variations in input buffers by applying a bias to an RC calibration network. U.S. Pat. No. 6,100,761 (Ezell) is directed to a linear variable gain low noise amplifier, wherein gain is controlled through segmented resistor having controllable components. U.S. Pat. No. 5,917,865 (Kopmeiners et al.) is directed to an automatic gain control in which an analog amplifier is controlled by a digital signal from a digital gain control circuit. U.S. Patent Application Publication 2001/0022821 (Ichihara) is directed to an amplitude deviation correction circuit that corrects amplitude deviation between an I and a Q signal.

SUMMARY OF THE INVENTION

It is an objective of the present invention to produce a gain correction that is connected to a gain control circuit to provide a self-calibrating gain control system.

It is further an object of the present invention to detect an output signal of a digital amplifier that is coupled in series with at least one analog amplifier.

It is still further an objective of the present invention to provide gain control in incremental steps in which correction of previous gain control steps are averaged with present gain correction to produce a moving average and providing a smooth gain of the output signal.

A digital gain control provides gain control in discrete steps to at least one analog amplifier and a digital amplifier coupled in series with the analog amplifier. To compensate for errors in the discrete steps, a signal detector, preferably a root-mean-square (RMS) circuit, detects the output of the digital amplifier and couples a value of the output signal of the digital amplifier to a gain step correction circuit. The gain step correction circuit couples to a digital gain control circuit a correction signal that is an average of present and past RMS values. The gain step correction results in a total gain of the analog and digital amplifiers that is a smooth linear and continuous gain.

BRIEF DESCRIPTION OF THE DRAWINGS

This invention will be described with reference to the accompanying drawings, wherein.

DETAILED DESCRIPTION

Figure 1:
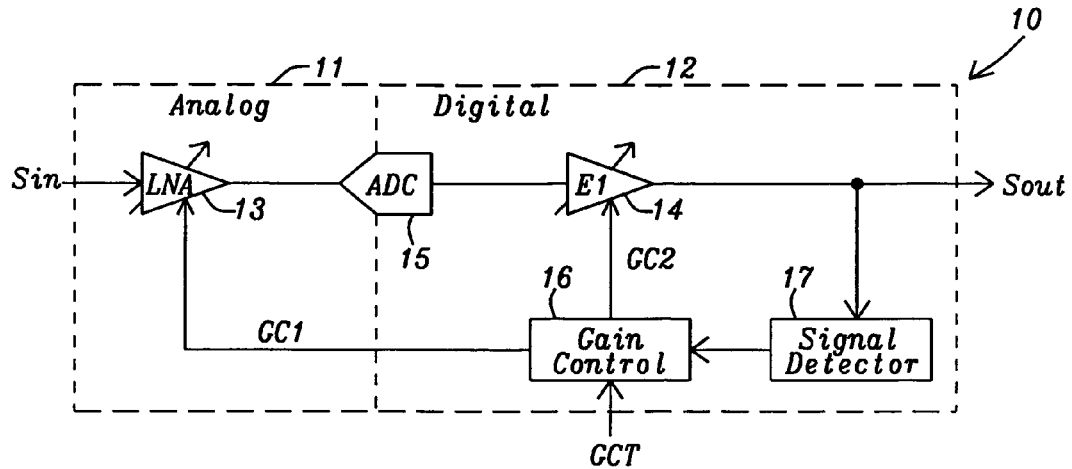
FIG. 1 is a block diagram of a gain control circuit of the present invention.

In FIG. 1 is shown a gain control circuit 10. The gain control circuit 10 is divided into an analog portion 11 and a digital portion 12. A signal in Sin is connected to a low noise amplifier (LNA) 13. The output of the LNA 13 is coupled to a digital amplifier E1 14 through an analog to digital converter (ADC) 15. A digital gain control circuit 16 controls both the LNA 13 and the digital amplifier 14 using gain control connections GC1 and GC2, respectively. Control input GCT to the gain control circuit directs either an increase or decrease in total gain of the LNA 13 and the digital amplifier E1 14, depending upon the value of the output signal detected by the signal detector 17. The signal detector 17 is preferable a root-mean-square (RMS) detector, but other signal detectors comprising a peak detector, envelope detector and power detector can also be used.

It should be noted and is within the scope of the present invention that the LNA 13 can be replaced by any digital gain controlled analog amplifier that is coupled to a digital amplifier in a fashion similar to that shown in FIG. 1, where the total gain from an analog signal input Sin to a digital signal out Sout is controlled by a gain control circuit 16.

Figure 2:
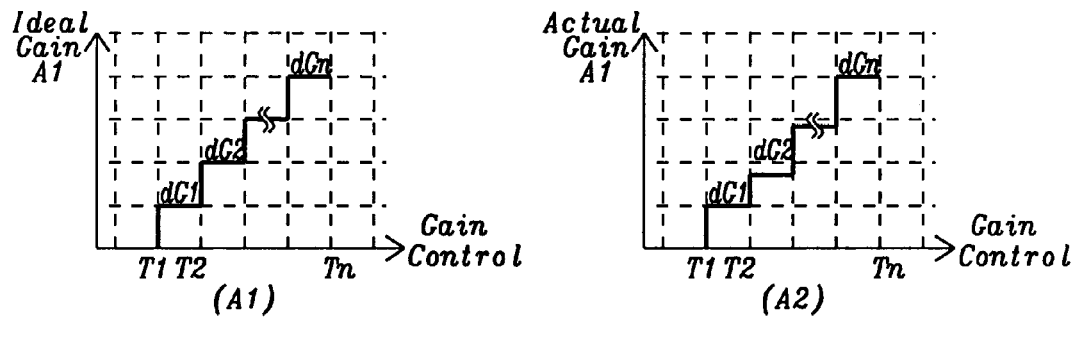
FIG. 2 is a set of diagrams depicting digital stepped gain control of the present invention.
Figure 2:
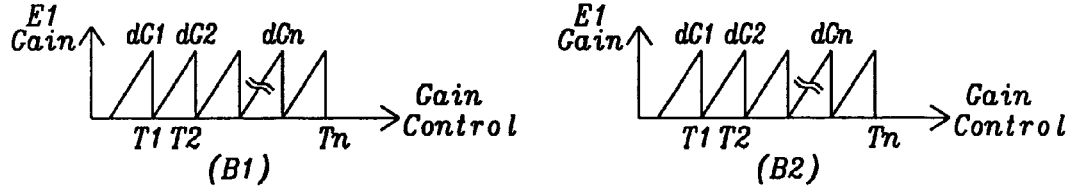
Figure 2:
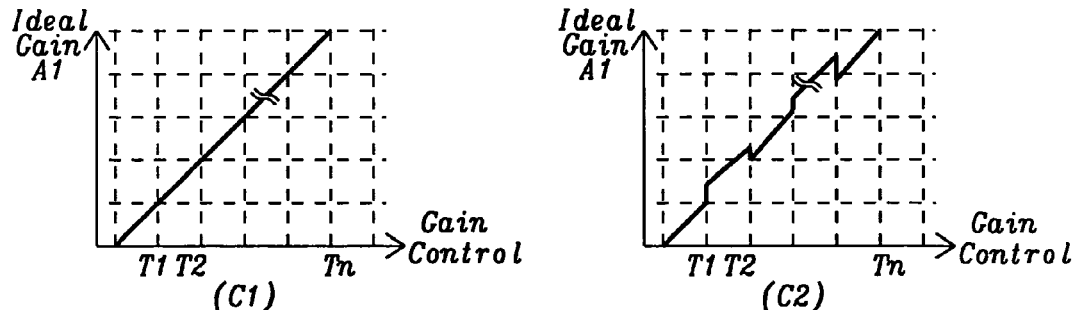

FIG. 2 is a set of graphs demonstrating gain control for the circuit of FIG. 1 The demonstrations exhibited in the graphs are an example of increasing gain in the amplifiers LNA 13 and E1 14 under the control of the gain control circuit 16. A similar set of graphs (not shown) would exemplify reducing the gain of the LNA and E1 amplifiers would be the same except the direction each graph would be in the downward direction. The graph shown in FIG. 2 (A1) demonstrates an ideal gain applied to the LNA 13. The gain is increased in equal discrete steps dG1 to dGn from the digital gain control circuit 16. During each of the time periods T1 to Tn the gain control circuit 16 issues a digital signal to control the LNA 13. In FIG. 2 (A2) manufacturing process variations and defects can produce varying discrete steps, even when the control input GC1 is uniform.

The graph of FIG. 2 (B1) demonstrates the ideal gain of the digital amplifier (E1) 14 under the control of the gain control circuit 16 through the gain control connection GC2. The maximum height of the gain control GC2 to the digital amplifier E1 is approximately equal to the height of each step used for the LNA shown in FIG. 2 (A1). This allows the digital amplifier gain to fill in the void between steps of the LNA and produce a smooth linear change in the total gain of the input signal Sin through to the output signal Sout. In FIG. 2 (B2) the digital amplifier gain is shown to be the same as in FIG. 2 (B1) since the continuous increments or decrements associated with the digital amplifier are a least significant bit, which are significantly smaller than the gain steps taken with the LNA and if a manufacturing process defect exist, produce a much smaller perturbation.

In the graph of FIG. 2 (C1) is shown the ideal total gain control results of the amplifiers LNA 13 and E1, which demonstrates a smooth continuous increase in total gain of the serial coupling of the LNA 13 and the E1 14 amplifiers. The result of gain step variation of the LNA creates perturbations in the total gain of an input signal Sin through to the output signal Sout as shown in FIG. 2 (C2). These perturbations can cause a false indication of excessive total gain adjustment of the LNA and E1 and therefore, can call for a reduction in gain immediately thereafter.

Figure 3:
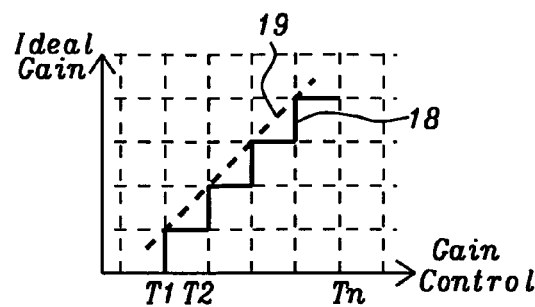
FIG. 3 is a diagram of an estimation of a linear gain using a stepped gain of the present invention.

FIG. 3 demonstrates the approximation of a linear gain 19 using a stepped gain 18. In the limit as the stepped gain 18 is reduced in amplitude and time period, the stepped gain 18 will approach the desired linear gain. This would result in slowing down the operation of changing the gain due to the slower response of the analog amplifier. Adding a digital amplifier to the gain path shown in FIG. 1 allows in the composite of the two gains the ability to have a smooth continuous gain adjustment within a much shorter total time period.

Figure 4:
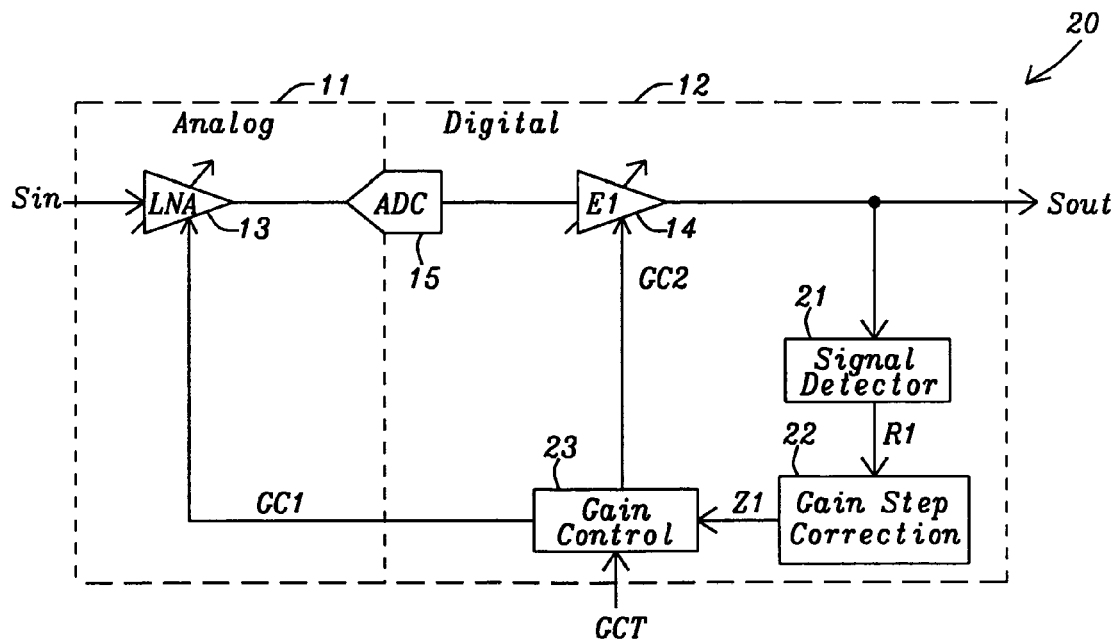
FIG. 4 is a block diagram of a gain control circuit using feed back of an output signal to provide correction to a digital gain control circuit.

An embodiment of the present invention is shown in FIG. 4 in which analog to digital circuitry 20 comprises an analog amplifier 13 coupled to a digital amplifier 14, which produces a signal out Sout. An analog signal Sin is connected to a low noise amplifier (LNA) 13. The output of the LNA is coupled to a digital amplifier 14 through an analog to digital converter (ADC) 15. The output of the digital amplifier 14 forms the signal output of the analog to digital circuitry 20. Both the LNA 13 and the digital amplifier 14 are controlled by a digital gain control circuit 23 that has a control input signal GCT, which determines when increased or decreased gain of the signal path from Sin to Sout is required. A signal detector monitors the output signal Sout and connects a signal value R1 of the output signal Sout to a gain step correction circuit 22. The signal detector is preferably a root-mean-square detector; however, other signal detectors comprising a peak detector, envelop detector and a power detector can also be used.

Contained within the gain step correction circuit are previous RMS values of Sout that were collected during previous gain adjustments. The previous RMS values are filtered, for example averaged, with the present captured RMS value of the output Sout to form a gain correction signal Z1, and the step gain correction signal Z1 is connected to the gain control circuit to overcome perturbations in the change of gain shown in FIG. 2 (C2), which results in a smooth, linear and continuous change in the gain between Sin and Sout similar to that shown in the graph of FIG. 2 (C1).

It should be noted that the circuitry in FIG. 4 is simplified to the minimum necessary components to perform the operation of the present invention. It is within the scope of the present invention that other electronic circuitry is connected between the signal input Sin and the signal output Sout, including additional stages of gain, which may or may not be variable gain amplifiers, which may or may not be controlled by the gain control circuit 23 shown in FIG. 4. Further, it should be noted that the LNA shown in FIG. 4 can be replaced with any digitally gain controlled analog amplifier 13 coupled in series with the digital amplifier 14, wherein the total gain of an analog input signal Sin, connected through the analog amplifier 13 and the digital amplifier 14, is controlled by the gain control circuit 23 to produce a smooth linear and continuous gain of the analog signal through to the digital output Sout of the digital amplifier.

While the invention has been particularly shown and described with reference to preferred embodiments thereof, it will be understood by those skilled in the art that various changes in form and details may be made without departing from the spirit and scope of the invention.

What is claimed is:

1. A step gain control system, comprising:
   an analog unit operable to change an amplification of an input signal according to a first gain step; and
   a digital unit operable to correct for the first gain step by an incremental adjustment of one or more second gain steps, the digital unit being in series with the analog unit and a magnitude of a second gain step being smaller than a magnitude of the first gain step, wherein the digital unit comprises a level detector operable to measure a digital signal level, and wherein the digital unit comprises a filter for filtering the digital signal level over time.

2. The system of claim 1, wherein the magnitude of each second gain step is significantly smaller than the magnitude of the first gain step.

3. The system of claim 1, wherein the one or more second gain steps are associated with a least significant bit of a digital word.

4. The system of claim 1, wherein the analog unit comprises a plurality of analog amplifiers.

5. The system of claim 1, wherein the analog unit comprises an analog to digital converter (ADC).

6. The system of claim 1, wherein the digital unit comprises a plurality of digital amplifiers.

7. The system of claim 1, wherein the analog unit is operable to increase amplification by the first gain step.

8. The system of claim 1, wherein the analog unit is operable to decrease amplification by the first gain step.

9. The system of claim 1, wherein the digital unit is operable to increase amplification by the one or more second gain steps.

10. The system of claim 1, wherein the digital unit is operable to decrease amplification by the one or more second gain steps.

11. The system of claim 1, wherein the digital unit is controlled according to the digital signal level.

12. The system of claim 1, wherein the amplification of the analog unit is controlled digitally.

13. The system of claim 1, wherein the analog unit comprises a gain controller operable to control the first gain step based on the digital signal level.

14. The system of claim 1, wherein said filtering comprises averaging present and past root mean square (RMS) values.

15. The system of claim 1, wherein said filtering comprises generating a moving average.

16. A method of gain control, comprising:
    changing an amplification of an input signal according to a first gain step in an analog unit;
    measuring a digital signal level; and
    correcting for the first gain step by applying an incremental adjustment of one or more second gain steps in a digital unit, the digital unit being in series with the analog unit and a magnitude of a second gain step being smaller than a magnitude of the first gain step, wherein correcting for the first gain step comprises filtering the digital signal level over time.

17. The method of claim 16, wherein each second gain step is significantly smaller than the first gain step.

18. The method of claim 16, wherein the one or more second gain steps are associated with a least significant bit of a digital word.

19. The method of claim 16, wherein the analog unit comprises a plurality of analog amplifiers.

20. The method of claim 16, wherein the analog unit comprises an analog to digital converter (ADC).

21. The method of claim 16, wherein the digital unit comprises a plurality of digital amplifiers.

22. The method of claim 16, wherein changing the amplification comprises increasing amplification.

23. The method of claim 16, wherein changing the amplification comprises decreasing amplification.

24. The method of claim 16, correcting for the first gain step comprises increasing amplification.

25. The method of claim 16, correcting for the first gain step comprises decreasing amplification.

26. The method of claim 16, wherein applying the incremental adjustment of one or more second gain steps is according to the digital signal level.

27. The method of claim 16, wherein the digital signal level is measured at an output of the digital unit.

28. The method of claim 16, wherein the changing of the amplification of the input signal is controlled digitally.

29. The method of claim 16, wherein the analog unit comprises a gain controller operable to control the first gain step based on the digital signal level.

30. The method of claim 16, wherein said filtering comprises averaging present and past root mean square (RMS) values.

31. The method of claim 16, wherein said filtering comprises generating a moving average.

\* \* \* \* \*